(12) United States Patent
Zhang et al.

(10) Patent No.: US 8,716,104 B1
(45) Date of Patent: May 6, 2014

(54) METHOD OF FABRICATING ISOLATION STRUCTURE

(71) Applicant: United Microelectronics Corporation, Hsinchu (TW)

(72) Inventors: Jian-Jun Zhang, Singapore (CN); Han-Chuan Fang, Singapore (SG); Xiao-Wei Shu, Singapore (CN); Jian-Dong Zhang, Singapore (CN); Yan-Jun Liu, Singapore (CN); Miao Zhang, Singapore (CN)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/721,021

(22) Filed: Dec. 20, 2012

(51) Int. Cl.
 *H01L 21/76* (2006.01)

(52) U.S. Cl.
 USPC .......................................... 438/435; 438/424

(58) Field of Classification Search
 USPC ................. 438/424, 427, 433, 435, 436, 438
 See application file for complete search history.

(56) References Cited

U.S. PATENT DOCUMENTS

| | | | |
|---|---|---|---|
| 3,150,299 A | 9/1964 | Noyce | |
| 3,256,465 A | 6/1966 | Weissenstem | |
| 3,323,198 A | 6/1967 | Shortes | |
| 3,343,256 A | 9/1967 | Smith | |
| 3,372,070 A | 3/1968 | Zuk | |
| 3,462,650 A | 8/1969 | Hennings | |
| 3,648,131 A | 3/1972 | Stuby | |
| 4,394,712 A | 7/1983 | Anthony | |
| 4,395,302 A | 7/1983 | Courduvelis | |
| 4,616,247 A | 10/1986 | Chang | |
| 4,773,972 A | 9/1988 | Mikkor | |
| 4,939,568 A | 7/1990 | Kato | |
| 4,968,636 A * | 11/1990 | Sugawara | 438/423 |
| 5,214,000 A | 5/1993 | Chazan | |
| 5,229,647 A | 7/1993 | Gnadinger | |
| 5,286,926 A | 2/1994 | Kimura | |
| 5,372,969 A | 12/1994 | Moslehi | |
| 5,399,898 A | 3/1995 | Rostoker | |
| 5,463,246 A | 10/1995 | Matsunami | |
| 5,484,073 A | 1/1996 | Erickson | |
| 5,502,333 A | 3/1996 | Bertin | |
| 5,627,106 A | 5/1997 | Hsu | |
| 5,793,115 A | 8/1998 | Zavracky | |
| 5,977,640 A | 11/1999 | Bertin | |
| 6,018,196 A | 1/2000 | Noddin | |
| 6,143,616 A | 11/2000 | Geusic | |
| 6,274,937 B1 | 8/2001 | Ahn | |

(Continued)

OTHER PUBLICATIONS

U.S. Appl. No. 13/108,969, filed Oct. 27, 2010.

*Primary Examiner* — Kevin M Picardat
(74) *Attorney, Agent, or Firm* — Ding Yu Tan

(57) ABSTRACT

A method of fabricating an isolation structure of a semiconductor device includes the following steps. Firstly, a substrate including a first surface and a second surface is provided. At least one trench is formed in the first surface of the substrate. The trench has a sidewall and a bottom surface. Then, a first chemical vapor deposition process is performed to form a first isolation layer on the first surface of the substrate and the sidewall and the bottom surface of the trench. Then, an anisotropic surface treatment process is performed, so that a surface of the first isolation layer has differential surface chemical properties. Afterwards, a second chemical vapor deposition process is performed to form a second isolation layer on the first isolation layer with a surface having differential surface chemical properties.

16 Claims, 2 Drawing Sheets

(56) References Cited

U.S. PATENT DOCUMENTS

| | | |
|---|---|---|
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,564,115 B2 | 7/2009 | Chen |
| 7,598,607 B2 | 10/2009 | Chung |
| 7,633,165 B2 | 12/2009 | Hsu |
| 7,732,926 B2 | 6/2010 | Uchiyama |
| 7,795,735 B2 | 9/2010 | Hsu |
| 7,812,426 B2 | 10/2010 | Peng |
| 7,816,227 B2 | 10/2010 | Chen |
| 7,825,024 B2 | 11/2010 | Lin |
| 7,825,517 B2 | 11/2010 | Su |
| 7,843,064 B2 | 11/2010 | Kuo |
| 7,846,837 B2 | 12/2010 | Kuo |
| 7,851,346 B2 | 12/2010 | Lee |
| 7,928,534 B2 | 4/2011 | Hsu |
| 7,932,608 B2 | 4/2011 | Tseng |
| 7,939,941 B2 | 5/2011 | Chiou |
| 7,955,895 B2 | 6/2011 | Yang |
| 7,956,442 B2 | 6/2011 | Hsu |
| 7,969,013 B2 | 6/2011 | Chen |
| 8,026,592 B2 | 9/2011 | Yoon |
| 8,034,708 B2 | 10/2011 | Kuo |
| 8,049,327 B2 | 11/2011 | Kuo |
| 8,053,898 B2 | 11/2011 | Marcoux |
| 8,053,900 B2 | 11/2011 | Yu |
| 8,053,902 B2 | 11/2011 | Chen |
| 8,063,496 B2 | 11/2011 | Cheon |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0082454 A1* | 4/2007 | Stommer et al. ............. 438/424 |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0041197 A1* | 2/2010 | Yamamoto .................. 438/270 |
| 2010/0140749 A1 | 6/2010 | Kuo |
| 2010/0140772 A1 | 6/2010 | Lin |
| 2010/0244247 A1 | 9/2010 | Chang |
| 2010/0323478 A1 | 12/2010 | Kuo |

* cited by examiner

METHOD OF FABRICATING ISOLATION STRUCTURE

FIELD OF THE INVENTION

The present invention relates to a method of fabricating an isolation structure, and more particularly to a method of fabricating an isolation structure of a semiconductor device.

BACKGROUND OF THE INVENTION

In the sub-nanometer generation, the size of the semiconductor device is gradually decreased, and the integration degree of the integrated circuit is largely enhanced. Correspondingly, the conductive holes formed in a semiconductor substrate for connecting various metal line layers become smaller and smaller. For example, since a through silicon via (TSV) in a silicon fabrication process is small-sized, the aspect ratio of the TSV is increased. For electrically isolating the TSV from the neighboring active components, before the metallic material is filled into the TSV, a liner oxide layer is formed on a sidewall and a bottom surface of the TSV to isolate the metallic material. However, since the aspect ratio of the TSV is high, the thickness of the liner oxide layer on the sidewall and the bottom surface of the TSV is not uniformly distributed. Due to the non-uniform thickness of the liner oxide layer, the stress of the isolation structure is not uniformly distributed or the electrical connection of the TSV conductor is deteriorated.

On the other hand, the uniformity of the thickness of the liner oxide layer on the TSV may be enhanced by using a thermal oxidation process. However, as the thickness of the liner oxide layer is increased, the thickness of the sidewall of the TSV becomes more non-uniform. In addition, after the thermal oxidation process is performed, an additional oxide layer is formed on a part of the surface of the silicon substrate. Since the oxide layer being found at some positions of the substrate (e.g. the backside of the substrate) is considered undesirable, an additional step of removing the oxide layer is necessary. Furthermore, since the thermal oxidation process is carried out at a relatively high temperature, the doped region in the active region of the semiconductor device is adversely affected or a metal layer for transferring electric energy is possibly damaged. In other words, the applications of the thermal oxidation process in the TSV fabrication process are restricted.

Therefore, there is a need of providing an improved method of fabricating an isolation structure of a semiconductor substrate.

SUMMARY OF THE INVENTION

In accordance with an aspect, the present invention provides a method of fabricating an isolation structure of a semiconductor device. The method includes the following steps. Firstly, a substrate including a first surface and a second surface is provided. At least one trench is formed in the first surface of the substrate. The trench has a sidewall and a bottom surface. Then, a first chemical vapor deposition process is performed to form a first isolation layer on the first surface of the substrate and the sidewall and the bottom surface of the trench. Then, an anisotropic surface treatment process is performed, so that a surface of the first isolation layer has differential surface chemical properties. Afterwards, a second chemical vapor deposition process is performed to form a second isolation layer on the first isolation layer, and the surface of the first isolation layer is with differential surface chemical properties.

After a chemical vapor deposition process is performed to form an isolation layer on the first surface of the substrate and the sidewall and the bottom surface of the trench, an anisotropic surface treatment process is performed to result in differential surface chemical properties of the isolation layer. Consequently, the isolation structure has the good step coverage percentage and the good isolating effect.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1D are schematic cross-sectional views illustrating a partial process flow of a method of fabricating an isolation structure according to an embodiment of the present invention.

Figure 1A:
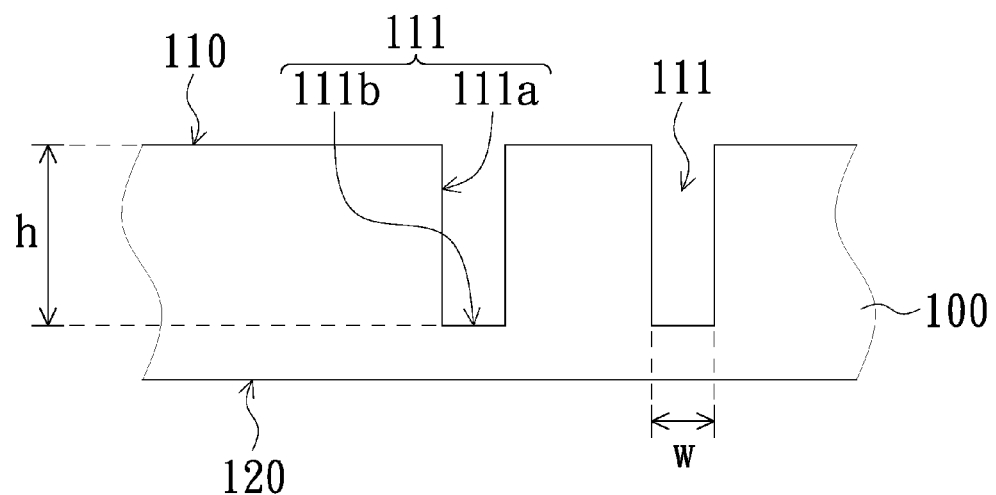
FIGS. 1A~1D are schematic cross-sectional views illustrating a partial process flow of a method of fabricating an isolation structure according to an embodiment of the present invention.

Firstly, as shown in FIG. 1A, a substrate 100 is provided. An example of the substrate 100 includes but is not limited to a silicon substrate, a germanium substrate, a silicon-on-insulator (SOI) substrate or a germanium-on-insulator (GOI) substrate. The substrate 100 may be an element semiconductor substrate. The substrate 100 has a first surface 110 and a second surface 120. At least one trench 111 is formed in the first surface 110. The trench 111 has a sidewall 111a and a bottom surface 111b. Furthermore, some functional circuits and trace patterns (not shown) are formed on the first surface 110 or in the substrate 100. The trench 111 runs from the first surface 110 of the substrate 100 to the bottom surface 111b of the trench 111. In an embodiment, the depth h of the trench 111 is in the range between 100 nanometers and 100 micrometers. The width w of the trench 111 at the first surface 110 of the substrate 100 is smaller than the depth h of the trench 111. That is, the trench 111 has a high aspect ratio (h/w>1).

Figure 1B:
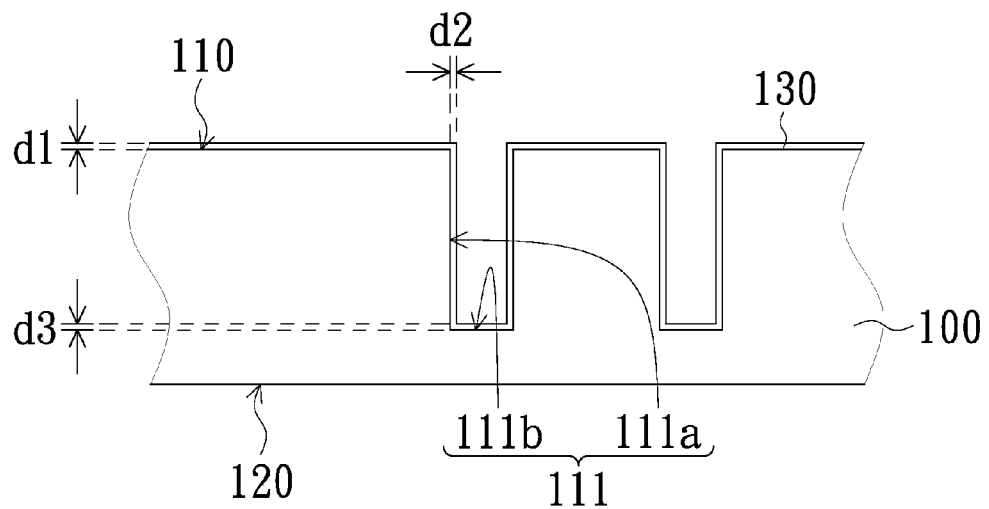

Then, as shown in FIG. 1B, a first chemical vapor deposition process using a first gas is performed to form a layer of the first gas on the first surface 110 of the substrate 100 and the sidewall 111a and the bottom surface 111b of the trench 111 under a specified pressure. The specified pressure is not higher than 1 atm. For example, the specified pressure is in the range between 0.1 and 1 atm. In an embodiment, the first chemical vapor deposition process is a sub-atmospheric chemical vapor deposition (SAVCD) process, wherein the sub-atmospheric pressure is lower than 1 atm. Alternatively, in some embodiments, the first chemical vapor deposition process is an atmospheric pressure CVD process or a low pressure CVD process. Moreover, the first gas is for example a silane gas ($SiH_4$), a tetraethylorthosilicate gas (TEOS, $Si(OC_2H5)_4$), or any other gas capable of producing a dielectric material from reaction. Then, at a temperature lower than or equal to 550° C., a first isolation layer 130 is formed on the first surface 110, the sidewall 111*a* and the bottom surface 111*b*. In a preferred embodiment, the TEOS gas is selected as the first gas for forming the first isolation layer 130. Under this circumstance, the first isolation layer 130 formed on the first surface 110, the sidewall 111*a* and the bottom surface 111*b* is a silicon dioxide layer.

Generally, the performance of a chemical vapor deposition process is evaluated according to a thickness profile of a film layer formed on a spatial surface of a substrate. Moreover, a step coverage percentage is an index to evaluate the thickness profile of the film layer. The step coverage percentage includes a sidewall step coverage percentage and a bottom step coverage percentage. For example, as shown in FIG. 1B, the thickness of the first isolation layer 130 on the first surface 110 of the substrate 100 is d1; the thickness of the first isolation layer 130 on the sidewall 111*a* of the trench 111 is d2; and the thickness of the first isolation layer 130 on the bottom surface 111*b* of the trench 111 is d3. Consequently, the sidewall step coverage percentage is equal to the ratio d2/d1, and the bottom step coverage percentage is equal to the ratio d3/d1. If the difference between the ratio d2/d1 and the ratio d3/d1 is very large, the thickness of the film layer formed on the spatial surface of the substrate is not uniform. Under this circumstance, the conformality of the film layer is poor. Generally, the mobility of the precursor absorbed on the surface of the substrate during the chemical vapor deposition process may influence the conformality of the film layer. That is, if the mobility of the precursor at a specified site of the surface of the substrate is increased, the speed of forming the film layer at the specified site is decreased or the thickness of the film layer is decreased. Whereas, if the mobility of the precursor at a specified site of the surface of the substrate is decreased, the speed of forming the film layer at the specified site is increased or the thickness of the film layer is increased. For maintaining good conformality of the film layer on the spatial surface of the substrate (i.e. good thickness uniformity), the mobility of the precursor in an area of the surface of the substrate corresponding to the higher density of the deposition gas should be higher; and the mobility of the precursor in an area of the surface of the substrate corresponding to the lower density of the deposition gas should be lower. For achieving the above purposes, different areas of the surface of the film layer are treated to have differential surface chemical properties, so that the mobility of the precursor at different areas of the surface of the film layer is distinguished.

After the resulting structure as shown in FIG. 1B is produced, an anisotropic surface treatment process is performed according to the profile of the trench 111. Consequently, different areas of the surface of the first isolation layer 130 have differential surface chemical properties. In this embodiment, a low frequency power and a high frequency power are alternately applied to a gaseous material in order to produce a plasma gas. For example, the low frequency power is about 200 watts, and the high frequency power is about 1500 watts. The plasma gas includes a helium plasma gas, an oxygen plasma gas, or a combination thereof. Then, the anisotropic plasma gas strikes the surface of the first isolation layer 130, so that the molecules on the surface of the first isolation layer 130 have differential charge energy levels. Generally, the striking amount and angle of the plasma gas are in proportion to the striking energy of the plasma gas transferred. In view of the differences in the charge energy levels of the molecules on the surface of the first isolation layer 130, the charge energy level of the first isolation layer 130 on the first surface 110 is greater than the charge energy level of the first isolation layer 130 on the bottom surface 111*b*, and the charge energy level of the first isolation layer 130 on the bottom surface 111*b* is greater than the charge energy level of the first isolation layer 130 on the sidewall 111*a*.

Figure 1C:
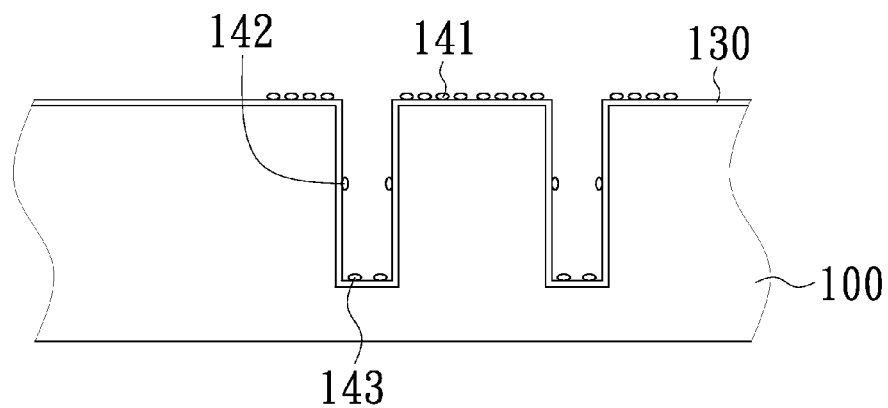

Then, with the charge energy levels of the molecules on the surface of the first isolation layer 130, a second chemical vapor deposition process is performed. As shown in FIG. 1C, the second chemical vapor deposition process is performed using a second gas under a specified pressure. Consequently, a plurality of parts 141, 142 and 143 of the precursor are formed on the first isolation layer 130 in the various different areas corresponding to the first surface 110 of the substrate 100, the sidewall 111*a* of the trench 111 and the bottom surface 111*b* of the trench 111, respectively. The specified pressure is not higher than 1 atm. For example, the specified pressure is in the range between 0.1 and 1 atm. In an embodiment, the second chemical vapor deposition process is a sub-atmospheric chemical vapor deposition (SAVCD) process, wherein the sub-atmospheric pressure is lower than 1 atm. Moreover, the first gas is for example a silane gas, a TEOS gas, or any other gas capable of producing a dielectric material from reaction.

Then, the precursor is thermally treated at a temperature lower than or equal to 550° C. Consequently, a second isolation layer 140 is formed on the first isolation layer 130 (see FIG. 1D). Moreover, in view of the different charge energy levels of the molecules found on the surface of the first isolation layer 130, the mobility of the part 141 of the precursor above the first isolation layer 130 on the first surface 110 is greater than the mobility of the part 143 of the precursor above the first isolation layer 130 on the bottom surface 111*b*, and the mobility of the part 143 of the precursor above the first isolation layer 130 on the bottom surface 111*b* is greater than the mobility of the part 142 of the precursor above the first isolation layer 130 on the sidewall 111*a*. Since the parts 141, 142 and 143 of the precursor have different mobility values, the rates for forming the second isolation layer 140 on different sites or areas of the first isolation layer 130 are identical.

Figure 1D:
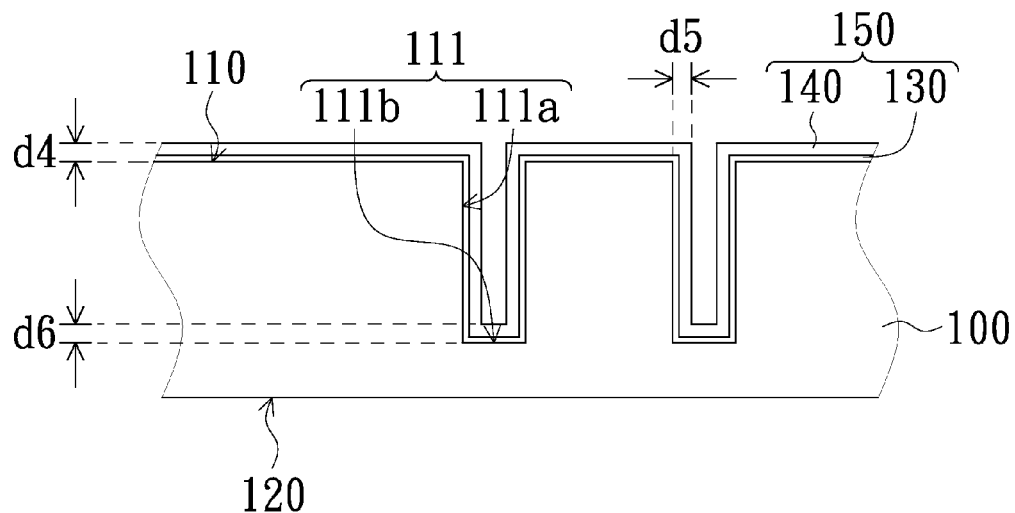

Please refer to FIG. 1D. Since the rate of forming the second isolation layer 140 on different areas of the first isolation layer 130 are identical, an isolation structure 150, which includes the second isolation layer 140 and the first isolation layer 130, has a good step coverage percentage. As shown in FIG. 1D, the thickness of the isolation structure 150 on the first surface 110 of the substrate 100 is d4; the thickness of the isolation structure 150 on the sidewall 111*a* of the trench 111 is d5; and the thickness of the isolation structure 150 on the bottom surface 111*b* of the trench 111 is d6. Consequently, the sidewall step coverage percentage is equal to d5/d4, and the bottom step coverage percentage is equal to d6/d4. Both of the sidewall step coverage percentage and the bottom step coverage percentage are approximately 100%. In this embodiment, since the TEOS gas is selected as the first gas and the second gas, the oxide layer is not formed at the position or location where the oxide layer is undesired. Moreover, since the first isolation layer and the second isolation layer are made of the same material, the isolation structure (e.g. a silicon oxide layer) has a good step coverage percentage and provides a good isolating effect.

It is noted that the above procedures or steps may be repeatedly performed many times to laminate more than two isolation layers as the isolation structure to reach a desired thickness. Moreover, different gases may be used to sequentially form an isolation structure including a plurality of isolation layers with different materials. By performing the fabricating method of the present invention, the doped region of the active region of the semiconductor device is not adversely affected, or the metal layer for transferring electric energy is not damaged. Consequently, in any stage of the TSV forming process, a good conformality of the isolation structure can be effectively maintained. Moreover, in a case where the isolation structure is applied to an interposer of an active region of a three-dimensional semiconductor device or a three-dimensional chipset, the isolation structure also provides superior or improved isolating effect, step coverage percentage and surface evenness.

From the above descriptions, the present invention provides a method of fabricating an isolation structure. After a chemical vapor deposition process is performed to form an isolation layer on the first surface of the substrate and the sidewall and the bottom surface of the trench, an anisotropic surface treatment process is performed to result in achieving differential surface chemical properties of the surface of the isolation layer. Consequently, the isolation structure has good step coverage percentage and isolating effect. After the metallic material is filled into the trench, the uniformity of the thickness of the metallic material is enhanced, and thus the performance of the integrated circuit is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating an isolation structure of a semiconductor device, the method comprising steps of:
   providing a substrate including a first surface and a second surface, wherein at least one trench is formed in the first surface of the substrate, and the trench has a sidewall and a bottom surface;
   performing a first chemical vapor deposition process to form a first isolation layer on the first surface, the sidewall and the bottom surface;
   performing an anisotropic surface treatment process, so that a surface of the first isolation layer has differential surface chemical properties; and
   performing a second chemical vapor deposition process to form a second isolation layer on the first isolation layer, the surface of the first isolation having differential surface chemical properties.

2. The method according to claim 1, wherein the substrate is an element semiconductor substrate.

3. The method according to claim 1, wherein the trench runs through the substrate from the first surface of the substrate to the bottom surface of the trench, wherein the trench has a depth between 100 nanometers and 100 micrometers.

4. The method according to claim 1, wherein the first chemical vapor deposition process is carried out under a pressure not higher than 1 atm.

5. The method according to claim 1, wherein the first chemical vapor deposition process is carried out at a temperature not higher than 550° C.

6. The method according to claim 4, wherein the first isolation layer is formed by using a tetraethylorthosilicate (TEOS) gas.

7. The method according to claim 1, wherein the first isolation layer is an oxide layer.

8. The method according to claim 1, wherein a low frequency power and a high frequency power are alternately applied to a gaseous material to produce a plasma gas, wherein the plasma gas strikes the surface of the first isolation layer, so that the surface of the first isolation layer has differential surface chemical properties.

9. The method according to claim 8, wherein the low frequency power is 200 watts, and the high frequency power is 1500 watts.

10. The method according to claim 8, wherein the plasma gas includes a helium plasma gas.

11. The method according to claim 8, wherein the plasma gas includes an oxygen plasma gas.

12. The method according to claim 8, wherein the first isolation layer formed on the first surface, on the sidewall and on the bottom surface have different charge energy levels, so that the surface of the first isolation layer has differential surface chemical properties.

13. The method according to claim 1, wherein the second chemical vapor deposition process is carried out under a pressure not higher than 1 atm.

14. The method according to claim 1, wherein the second chemical vapor deposition process is carried out at a temperature not higher than 550° C.

15. The method according to claim 1, wherein the second isolation layer is formed by using a tetraethylorthosilicate (TEOS) gas.

16. The method according to claim 1, wherein the second isolation layer is an oxide layer.

* * * * *